(12) United States Patent
Lou

(10) Patent No.: US 11,115,178 B1
(45) Date of Patent: Sep. 7, 2021

(54) CLOCK AND DATA RECOVERY DEVICE AND CLOCK AND DATA RECOVERY METHOD

(71) Applicant: REALTEK SEMICONDUCTOR CORPORATION, Hsinchu (TW)

(72) Inventor: Jia-Ning Lou, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/099,819

(22) Filed: Nov. 17, 2020

(30) Foreign Application Priority Data

Mar. 5, 2020 (CN) .......................... 202010145534.9

(51) Int. Cl.
| | |
|---|---|
| *H03D 3/24* | (2006.01) |
| *H04L 7/033* | (2006.01) |
| *H03L 7/089* | (2006.01) |
| *H03L 7/08* | (2006.01) |
| *H03L 7/099* | (2006.01) |
| *H03M 9/00* | (2006.01) |

(52) U.S. Cl.
CPC ............ *H04L 7/033* (2013.01); *H03L 7/0807* (2013.01); *H03L 7/0891* (2013.01); *H03L 7/099* (2013.01); *H03M 9/00* (2013.01)

(58) Field of Classification Search
CPC ..... H04L 7/033; H04L 7/0016; H03L 7/0891; H03L 7/0896; H03L 7/099; H03L 7/0807; H03M 9/00
USPC .......................... 375/373–376, 355, 326, 327
See application file for complete search history.

(56) References Cited

U.S. PATENT DOCUMENTS

| | | |
|---|---|---|
| 9,264,219 B1 | 2/2016 | Kang et al. |
| 2005/0116750 A1* | 6/2005 | Tsai ...................... H03L 7/0896 327/156 |

(Continued)

FOREIGN PATENT DOCUMENTS

TW        I535213 B        5/2016

OTHER PUBLICATIONS

OA letter of the counterpart TW application (appl. No. 109108339) mailed on Sep. 17, 2020 Summary of the OA letter: 1. Claim 9 is rejected as allegedly being unpatentable over cited reference 1 (US 20110267122 A1) in view of cited reference 2 (TW I535213 B, also published as U.S. Pat. No. 9,264,219 B1). 2. Claims 1-8 and 10 are allowable.

*Primary Examiner* — Phuong Phu
(74) *Attorney, Agent, or Firm* — WPAT, PC

(57) ABSTRACT

A clock and data recovery device includes a phase detector circuitry, an analog modulation circuitry, a serial-to-parallel converter circuit, a digital modulation circuitry, and an oscillator circuit. The phase detector circuitry detects a data signal according to first and second clock signals to generate an up signal and a down signal. The analog modulation circuitry generates a first adjustment signal according to the up signal and the down signal. The serial-to-parallel converter circuit generates a first control signal according to the up signal, and to generate a second control signal according to the down signal. The digital modulation circuitry generates a digital code according to the first and the second control signals, and to generate a second adjustment signal according to the digital code. The oscillator circuit generates the first and the second clock signals according to the first adjustment signal and the second adjustment signal.

15 Claims, 5 Drawing Sheets

(56) References Cited

U.S. PATENT DOCUMENTS

| | | | |
|---|---|---|---|
| 2006/0203939 A1* | 9/2006 | Chou | H04L 7/033 |
| | | | 375/319 |
| 2009/0074123 A1* | 3/2009 | Hsueh | H04L 7/033 |
| | | | 375/360 |
| 2011/0267122 A1 | 11/2011 | Jeong et al. | |
| 2012/0008727 A1* | 1/2012 | Mohajeri | H04L 7/033 |
| | | | 375/376 |
| 2018/0198597 A1* | 7/2018 | Huang | H04L 7/0016 |
| 2020/0213076 A1* | 7/2020 | Tanaka | H03L 7/099 |

\* cited by examiner

CLOCK AND DATA RECOVERY DEVICE AND CLOCK AND DATA RECOVERY METHOD

BACKGROUND OF THE INVENTION

1. Field of the Invention

The present disclosure relates to a clock and data recovery device, especially to a clock and data recovery device employing a mixed control of analog circuit(s) and digital circuit(s) and a clock and data recovery method.

2. Description of Related Art

With rapid development of process technology, operating speed of an integrated circuit is significantly improved. In a high speed communication system, a clock and data recovery (CDR) circuit is widely utilized to assure that a received input data can be correctly read. In current approaches, the CDR circuit is implemented with all analog circuits or all digital circuits. If an implementation of the all analog circuits is employed, the CDR circuit is required to utilize a capacitor having higher capacitance value. As a result, a leakage current may exist in the CDR circuit, which degrades the performance of the CDR circuit, and such capacitor may waste more circuit area. If an implementation of the all digital circuits is employed, the CDR circuit may have a weaker ability of tracking phases due to limitations of timing delay or other issues.

SUMMARY OF THE INVENTION

In some embodiments, a clock and data recovery device includes a phase detector circuitry, an analog modulation circuitry, a serial-to-parallel converter circuit, a digital modulation circuitry, and an oscillator circuit. The phase detector circuitry is configured to detect a data signal according to a first clock signal and a second clock signal, in order to generate an up signal and a down signal. The analog modulation circuitry is configured to generate a first adjustment signal according to the up signal and the down signal. The serial-to-parallel converter circuit is configured to generate a first control signal according to the up signal, and to generate a second control signal according to the down signal. The digital modulation circuitry is configured to generate a digital code according to the first control signal and the second control signal, and to generate a second adjustment signal according to the digital code. The oscillator circuit is configured to generate the first clock signal and the second clock signal according to the first adjustment signal and the second adjustment signal.

In some embodiments, a clock and data recovery method includes the following operations: detecting a data signal according to a first clock signal and a second clock signal, in order to generate an up signal and a down signal; generating, by an analog modulation circuitry, a first adjustment signal according to the up signal and the down signal; generating a first control signal according to the up signal, and generating a second control signal according to the down signal; and generating, by a digital modulator circuitry, a digital code according to the first control signal and the second control signal, and generating a second adjustment signal according to the digital code; and generating the first clock signal and the second clock signal according to the first adjustment signal and the second adjustment signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference numbers.

Figure 1:
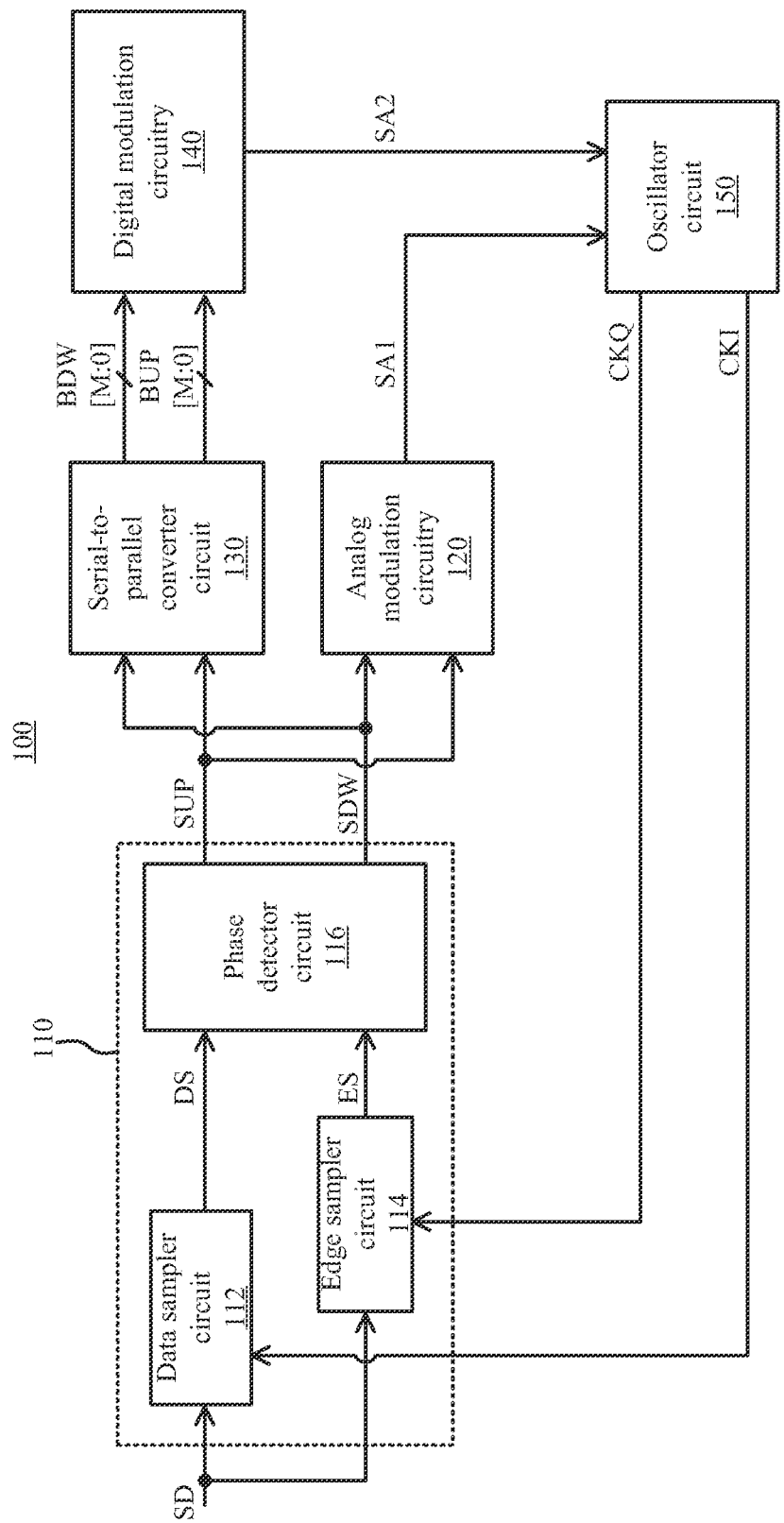
FIG. 1 is a schematic diagram of a clock and data recovery (CDR) device according to some embodiments of the present disclosure.

FIG. 1 is a schematic diagram of a clock and data recovery (CDR) device 100 according to some embodiments of the present disclosure. The CDR device 100 utilizes a mixed control of analog circuit(s) and digital circuit(s) to adjust a clock signal CKI and a clock signal CKQ, in order to improve the performance and to save the circuit area.

The CDR device 100 includes a phase detector circuitry 110, an analog modulation circuitry 120, a serial-to-parallel converter circuit 130, a digital modulation circuitry 140, and an oscillator circuit 150. In some embodiments, the phase detector circuitry 110 detects a data signal SD according to the clock signal CKI and the clock signal CKQ, in order to generate an up signal SUP and a down signal SDV. In some embodiments, the phase detector circuitry 110 may be implemented with a bang-bang phase detector circuit. For example, the phase detector circuitry 110 includes a data sampler circuit 112, an edge sampler circuit 114, and a phase detector circuit 116. The data sampler circuit 112 samples the data signal SD according to the clock signal CKI, in order to generate a data sample DS. The edge sampler circuit 114 samples the data signal SD according to the clock signal CKQ, in order to generate an edge sample ES. The clock signal CKI and the clock signal CKQ are different in phase by about 90 degrees. The phase detector circuit 116 may analyze a phase difference between the data sample DS and the edge sample ES, in order to generate the up signal SUP and the down signal SDW.

The analog modulation circuitry 120 generates an adjustment signal SA1 according to the up signal SUP and the down signal SDW. In some embodiments, the analog modulation circuitry 120 operates as a proportional control path of the CDR device 100. The serial-to-parallel converter circuit 130 generates a control signal BUP having M+1 bits (i.e., [M:0]) according to the up signal SUP, and generates a control signal BDW having M+1 bits according to the down signal SDW, in which M is a positive integer greater than or equal to 1. In some embodiments, the serial-to-parallel converter circuit 130 is configured to lower a speed of the up signal SUP and that of the down signal SDW. In some embodiments, the serial-to-parallel converter circuit 130 may be implemented with a demultiplexer circuit, but the present disclosure is not limited thereto. In some embodiments, if a speed of the digital modulation circuitry 140 is sufficiently high, the up signal SUP and the down signal SDW may be directly inputted to the digital modulation circuitry 140 (i.e., the serial-to-parallel converter circuit 130 may not be utilized).

Figure 3:
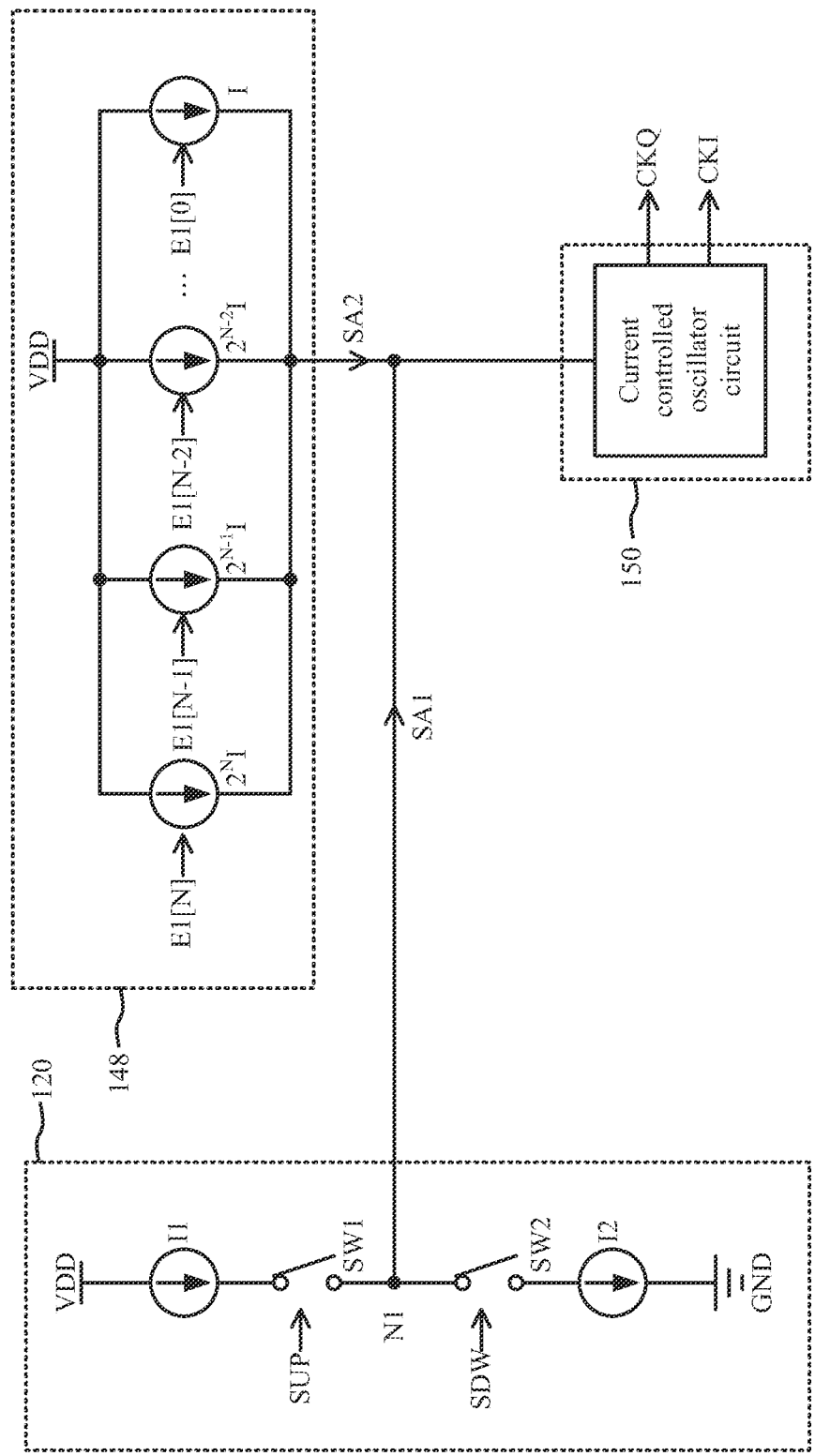
FIG. 3 is a schematic diagram of the analog modulation circuitry, the oscillator circuit in FIG. 1, and the digital to analog converter (DAC) circuit in FIG. 2 according to some embodiments of the present disclosure.
Figure 4:
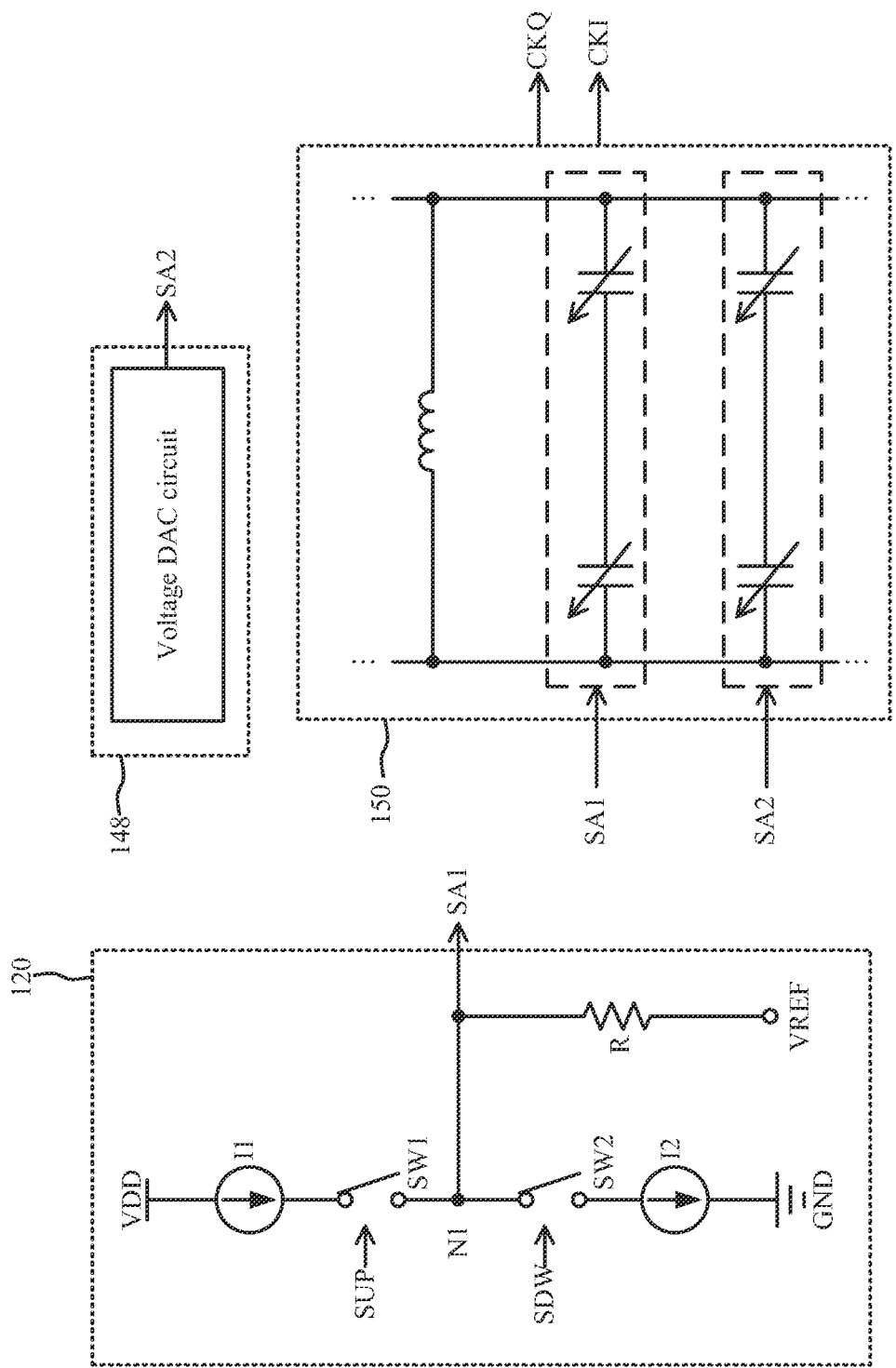
FIG. 4 is a schematic diagram of the analog modulation circuitry and the oscillator circuit in FIG. 1 and the DAC circuit in FIG. 2 according to some embodiments of the present disclosure.

The digital modulation circuitry 140 generates a digital code (e.g., digital code E1 in FIG. 2) according to the control signal BUP and the control signal BDW, and generates an adjustment signal SA2 according to this digital code. In some embodiments, the digital modulation circuitry 140 operates as an integral path of the CDR device 100. The oscillator circuit 150 generates the clock signal CKI and the clock signal CKQ, and adjusts the clock signal CKI and the clock signal CKQ according to the adjustment signal SA1 and the adjustment signal SA2. In some embodiments, as shown in FIG. 3, the digital modulation circuitry 140 may include a current digital to analog converter (DAC) circuit. Under this condition, the oscillator circuit 150 is a current controlled oscillator circuit. In some embodiments, as shown in FIG. 4, the digital modulation circuitry 140 may include a voltage DAC circuit. Under this condition, the oscillator circuit 150 is a voltage controlled oscillator circuit.

In some approaches, a CDR device is implemented with all analog circuits. In these approaches, a loop filter in the CDR device requires a capacitor having higher capacitance value. As a result, higher circuit area is required. Moreover, this capacitor may cause a leakage current, and thus the circuit performance is decreased. In some other approaches, a CDR device is implemented with all digital circuits. In these approaches, the CDR device has a weaker ability of tracking phase variation due to timing delay of digital circuits. Compared with these approaches, as described above, in some embodiments of the present disclosure, the CDR device 100 utilizes the mixed control of the analog modulation circuitry 120 and the digital modulation circuitry 140, in which the analog modulation circuitry 120 operates as the proportional control path, and the digital modulation circuitry 140 operates as the integral path. As a result, the CDR device 100 is able to combine the advantages of the analog circuits and the digital circuits, in order to improve the performance while saving a certain circuit area.

Figure 2:
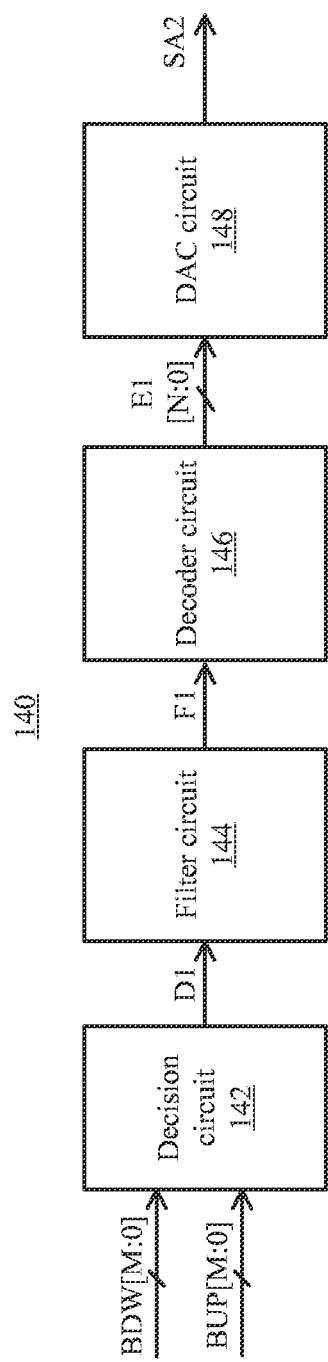
FIG. 2 is a schematic diagram of the digital modulation circuitry in FIG. 1 according to some embodiments of the present disclosure.

FIG. 2 is a schematic diagram of the digital modulation circuitry 140 in FIG. 1 according to some embodiments of the present disclosure. The digital modulation circuitry 140 includes a decision circuit 142, a filter circuit 144, a decoder circuit 146, and a DAC circuit 148. The decision circuit 142 generates a decision signal D1 according to the control signal BDW and the control signal BUP. In some embodiments, the decision circuit 142 may be implemented with a digital signal processor circuit. In some embodiments, the decision circuit 142 compares a number of predetermined logic values (e.g., logic value of 1) in the control signal BUP with a number of predetermined logic values in the control signal BDW, in order to generate the decision signal D1.

For example, the M+1 bits of the control signal BUP include three logic values of 1, and the M+1 bits of the control signal BDW include one logic value of 1. Under this condition, the control signal BUP has more logic values of 1, and thus the decision circuit 142 outputs the decision signal D1 having a value of 1, in order to increase a frequency of the clock signal CKI and that of the clock signal CKQ. In an example, the M+1 bits the control signal BUP include one logic value of 1, and the M+1 bits of the control signal BDW include three logic values of 1. Under this condition, the control signal BUP has less logic values of 1, and thus the decision circuit 142 outputs the decision signal D1 having a value of −1, in order to decrease the frequency of the clock signal CKI and that of the clock signal CKQ. In another example, the M+1 bits of the control signal BUP include three logic values of 1, the M+1 bits of the control signal BDW include three logic values of 1. Under this condition, the control signal BUP and the control signal BDW have the same number of logic values of 1, and thus the decision circuit 142 outputs the decision signal D1 having a value of 0, in order to keep the frequency of the clock signal CKI and that of the clock signal CKQ.

The filter circuit 144 performs a filtering operation on the decision signal D1, in order to generate a signal F1. In some embodiments, the filter circuit 144 operates an up/down counter circuit. In greater detail, the filter circuit 144 accumulates the decision signal D1 for every period. When an accumulated value is greater than or equal to K, the filter circuit 144 sequentially increases the value of the signal F1. Alternatively, when the accumulated value is less than or equal to −K, the filter circuit 144 sequentially decreases the value of the signal F1. In some embodiments, K is for setting a gain of the filter circuit 144, in which the gain of the filter circuit 144 is 1/K. The decoder circuit 146 decodes the signal F1 to generate the digital code E1 having N+1 bits (i.e., [N:0]). The DAC circuit 148 converts the digital code E1 to the adjustment signal SA2, in which N is integer greater than or equal to 0.

FIG. 3 is a schematic diagram of the analog modulation circuitry 120, the oscillator circuit 150 in FIG. 1, and the DAC circuit 148 in FIG. 2 according to some embodiments of the present disclosure. In this example, the analog modulation circuitry 120 operates as a charge pump circuit which adjusts a level of a node N1 according to the up signal SUP and the down signal SDW, in order to output the adjustment signal SA1. In greater detail, the analog modulation circuitry 120 includes a current source I1, a current source I2, a switch SW1, and a switch SW2. The current source I1 is coupled between a voltage source that provides a voltage VDD and the switch SW1, and the current source I2 is coupled between the switch SW2 and a voltage source that provides a reference voltage (e.g., a ground voltage GND). A terminal of the switch SW1 and a terminal of the switch SW2 are coupled to the node N1.

If the switch SW1 is turned on according to the up signal SUP, a current of the current source I1 (which is equivalent to the adjustment signal SA1) is transmitted to the oscillator circuit 150 through the node N1 (which is equivalent to charging the node N1). As a result, the oscillator circuit 150 is able to generate the clock signal CKI and the clock signal CKQ that have higher frequencies. Alternatively, if the switch SW2 is turned on according to the down signal SDW, the node N1 is discharged through the current source I2, in order to lower the current flowing into the oscillator circuit 150 (which is equivalent to the adjustment signal SA1). As a result, the oscillator circuit 150 generates the clock signal CKI and the clock signal CKQ that have lower frequencies.

The DAC circuit 148 is a current DAC that includes current sources I, . . . , $2^N$I. The current source I is turned on according to a first bit (i.e., E1[0]) of the digital code E1. With this analogy, the current source $2^{N-2}$I is turned on according to an (N−1)-th bit (i.e., E1[N−2]) of the digital code E1. The current source $2^{N-1}$I is turned on according to an N-th bit (i.e., E1[N−1]) of the digital code E1. The current source $2^N$I is turned on according to an (N+1)-th bit (i.e., E1[N]) of the digital code E1. Therefore, the adjustment signal SA2 is a summation of the current(s) from the turned-on current source(s).

In this example, the oscillator circuit 150 is a current controlled oscillator (CCO) circuit. In some embodiments, the CCO circuit may be an inverter chain circuit (not shown) that is driven by a current mirror circuit (not shown), in which the current mirror is configured to replica a combination of the adjustment signal SA1 and the adjustment signal SA2. The output of the analog modulation circuitry 120 is coupled to the output of the DAC circuit 148, in order to sum up the adjustment signal SA1 and the adjustment signal SA2 (in this example, the adjustment signal SA1 and the adjustment signal SA2 are current signals). In response to the summation of the adjustment signal SA1 and the adjustment signal SA2, the oscillator circuit 150 adjusts the clock signal CKQ and the clock signal CKI. For example, when the summation of the adjustment signal SA1 and the adjustment signal SA2 is higher, the frequency of the clock signal CKQ and that of the clock signal CKI are higher. Alternatively, if the summation of the adjustment signal SA1 and the adjustment signal SA2 is less, the frequency of the clock signal CKQ and that of the clock signal CKI are lower.

FIG. 4 is a schematic diagram of the analog modulation circuitry 120 and the oscillator circuit 150 in FIG. 1 and the DAC circuit 148 in FIG. 2 according to some embodiments of the present disclosure. Compared with FIG. 3, in this example, the DAC circuit 148 is a voltage DAC circuit. For example, the DAC circuit 148 may be implemented with a resistive voltage divider (not shown), switches (not shown), and a buffer (not shown). The switches are turned on in response to the digital code E1, such that the resistive voltage divider generates an analog voltage corresponds to the digital code E1. The buffer outputs the analog voltage to be the adjustment signal SA2. The implementation of the voltage DAC circuit is given for illustrative purposes, and the present disclosure is not limited thereto. Various types of the voltage DAC circuit are within the contemplated scope of the present disclosure.

Furthermore, compared with to FIG. 3, the analog modulation circuitry 120 further includes a resistor R. A terminal of the resistor R is coupled to the node N1, and another terminal of the resistor R receives a reference voltage VREF (which may be, but not limited to, 0.5 Volts). As a result, the resistor R converts the adjustment signal SA1 in FIG. 3 to a voltage signal. In this example, the oscillator circuit 150 is a voltage controlled oscillator (VCO) circuit. In some embodiments, the VCO circuit may include LC tanks, in order to adjust the clock signal CKQ and the clock signal CKI according to the adjustment signal SA1 and the adjustment signal SA2. For example, a part of the LC tanks are set to be controlled by the adjustment signal SA1, and another part of the LC tanks are set to be controlled by the adjustment signal SA2. As a result, the oscillator circuit 150 generates the clock signal CKI and the clock signal CKQ in response to a combination of the adjustment signal SA1 and the adjustment signal SA2. The implementations of the VCO circuit are given for illustrative purposes, and the present disclosure is not limited thereto.

Figure 5:
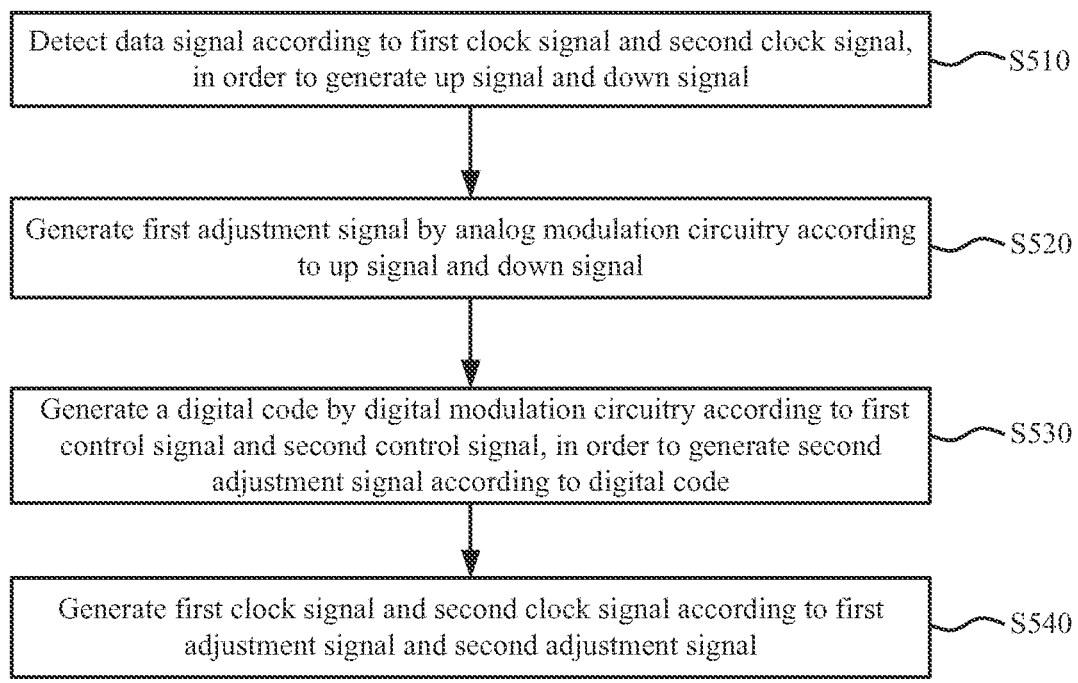
FIG. 5 is a flow chart of a CDR method according to some embodiments of the present disclosure.

FIG. 5 is a flow chart of a CDR method 500 according to some embodiments of the present disclosure. In some embodiments, the CDR method 500 may be, but not limited to, performed by the CDR device 100 in FIG. 1.

In operation S510, a data signal is detected according to a first clock signal and a second clock signal, in order to generate an up signal and a down signal.

In operation S520, a first adjustment signal is generated by an analog modulation circuitry according to the up signal and the down signal.

In operation S530, a digital code is generated by a digital modulation circuitry according to a first control signal and a second control signal, in order to generate a second adjustment signal according to the digital code.

In operation S540, the first clock signal and the second clock signal are generated according to the first adjustment signal and the second adjustment signal.

Operations S510, S520, S530, and S540 can be understood with reference to various embodiments discussed above, and thus the repetitious descriptions are not given. The above description of the CDR method 500 includes exemplary operations, but the operations are not necessarily performed in the order described above. Operations of the CDR method 500 may be added, replaced, changed order, and/or eliminated as appropriate, in accordance with the spirit and scope of various embodiments of the present disclosure.

As described above, the CDR device and the CDR method provided in some embodiments of the present disclosure are able to utilize a mixed control of analog circuit(s) and digital circuit(s) to adjust clock signal(s). As a result, the circuit performance is improved while the circuit area is saved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock and data recovery device, comprising:
    a phase detector circuitry configured to detect a data signal according to a first clock signal and a second clock signal, in order to generate an up signal and a down signal;
    an analog modulation circuitry configured to generate a first adjustment signal according to the up signal and the down signal;
    a serial-to-parallel converter circuit configured to generate a first control signal according to the up signal, and to generate a second control signal according to the down signal;
    a digital modulation circuitry configured to generate a digital code according to the first control signal and the second control signal, and to generate a second adjustment signal according to the digital code; and
    an oscillator circuit configured to generate the first clock signal and the second clock signal according to the first adjustment signal and the second adjustment signal.

2. The clock and data recovery device of claim 1, wherein the analog modulation circuitry is configured to operate as a proportional control path, and the digital modulation circuitry is configured to operate as an integral path.

3. The clock and data recover device of claim 1, wherein the analog modulation circuitry comprises:
    a charge pump circuit configured to adjust a level of a node according to the up signal and the down signal, in order to output the first adjustment signal.

4. The clock and data recover device of claim 3, wherein if the oscillator circuit is a voltage controlled oscillator, the analog modulation circuitry further comprises:
    a resistor, wherein a first terminal of the resistor is coupled to the node, and a second terminal of the resistor is configured to receive a reference voltage.

5. The clock and data recovery device of claim 1, wherein the digital modulation circuitry comprises:
    a decision circuit configured to generate a decision signal according to the first control signal and the second control signal;
    a filter circuit configured to perform a filtering operation on the decision signal, in order to generate a first signal;
    a decoder circuit configured to decode the first signal, in order to generate the digital code; and
    a digital to analog converter circuit configured to convert the digital code to the second adjustment signal.

6. The clock and data recover device of claim 5, wherein the digital to analog converter circuit is a current digital to analog converter circuit, the oscillator circuit is a current controlled oscillator circuit, and the current controlled oscillator circuit generates the first clock signal and the second clock signal according to a summation of the first adjustment signal and the second adjustment signal.

7. The clock and data recovery device of claim 5, wherein the digital to analog converter circuit is a voltage digital to analog converter circuit, the oscillator circuit is a voltage controlled oscillator circuit, and the voltage controlled oscillator circuit generates the first clock signal and the second clock signal according to a combination of the first adjustment signal and the second adjustment signal.

8. The clock and data recovery device of claim 5, wherein the decision circuit is configured to compare a number of predetermined logic values in the first control signal with a number of the predetermined logic values in the second control signal, in order to generate the decision signal.

9. A clock and data recovery method, comprising:
    detecting a data signal according to a first clock signal and a second clock signal, in order to generate an up signal and a down signal;
    generating, by an analog modulation circuitry, a first adjustment signal according to the up signal and the down signal;
    generating a first control signal according to the up signal, and generating a second control signal according to the down signal; and
    generating, by a digital modulator circuitry, a digital code according to the first control signal and the second control signal, and generating a second adjustment signal according to the digital code; and
    generating the first clock signal and the second clock signal according to the first adjustment signal and the second adjustment signal.

10. The clock and data recovery method of claim 9, wherein generating, by the digital modulator circuitry, the digital code according to the first control signal and the second control signal, and generating the second adjustment signal according to the digital code comprises:
    generating a decision signal according to the first control signal and the second control signal;
    performing a filtering operation on the decision signal, in order to generate a first signal;
    decoding the first signal, in order to generate the digital code; and
    converting the digital code to the second adjustment signal.

11. The clock and data recovery method of claim 10, wherein generating the decision signal according to the first control signal and the second control signal comprises:
    comparing a number of predetermined logic values in the first control signal with a number of the predetermined logic values in the second control signal, in order to generate the decision signal.

12. The clock and data recovery method of claim 10, wherein the digital modulation circuitry comprises a digital to analog converter circuit, the digital to analog converter circuit is configured to convert the digital code to the second adjustment signal, and generating the first clock signal and the second clock signal according to the first adjustment signal and the second adjustment signal comprises:
    generating, by a current controlled oscillator circuit, the first clock signal and the second clock signal according to a summation of the first adjustment signal and the second adjustment signal.

13. The clock and data recovery method of claim 10, wherein the digital modulation circuitry comprises a digital to analog converter circuit, the digital to analog converter circuit is configured to convert the digital code to the second adjustment signal, and generating the first clock signal and the second clock signal according to the first adjustment signal and the second adjustment signal comprises:

generating, by a voltage controlled oscillator circuit, the first clock signal and the second clock signal according to a combination of the first adjustment signal and the second adjustment signal.

14. The clock and data recovery method of claim 9, wherein the analog modulation circuitry is configured to operate as a proportional control path, and the digital modulation circuitry is configured to operate as an integral path.

15. The clock and data recovery method of claim 9, wherein the analog modulation circuitry comprises a charge pump circuit, and generating, by the analog modulation circuitry, the first adjustment signal according to the up signal and the down signal comprises:

adjusting, by the charge pump circuit, a level of a node according to the up signal and the down signal, in order to output the first adjustment signal.

\* \* \* \* \*